(12) United States Patent
Long

(10) Patent No.: US 8,913,454 B2
(45) Date of Patent: Dec. 16, 2014

(54) PROGRAMMABLE MEMORY WITH RESTRICTED REPROGRAMMABILITY

(71) Applicant: Cambridge Silicon Radio Limited, Cambridge (GB)

(72) Inventor: Mel Gerard Long, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 190 days.

(21) Appl. No.: 13/648,723

(22) Filed: Oct. 10, 2012

(65) Prior Publication Data

US 2014/0098605 A1    Apr. 10, 2014

(51) Int. Cl.
*G11C 17/18*    (2006.01)

(52) U.S. Cl.
USPC .......................... 365/225.7; 365/96; 365/201

(58) Field of Classification Search
CPC ........ G11C 17/16; G11C 17/18; G11C 16/10; G11C 29/027; G11C 17/00; G11C 17/06; G11C 11/39; G11C 11/56; G11C 29/021
USPC ......... 365/185.04, 195, 189.07, 225.6, 225.7, 365/185.05, 185.08, 185.33, 201, 94, 96
See application file for complete search history.

(56) References Cited

U.S. PATENT DOCUMENTS

| | | | |
|---|---|---|---|
| 5,966,339 A | 10/1999 | Hsu et al. | |
| 6,857,054 B2* | 2/2005 | Minne | 711/163 |
| 7,031,188 B2* | 4/2006 | Lee et al. | 365/185.04 |
| 7,142,452 B1* | 11/2006 | Tiwari | 365/185.04 |
| 7,623,378 B1* | 11/2009 | Wahlstrom et al. | 365/185.04 |
| 2006/0152959 A1 | 7/2006 | Jung et al. | |
| 2008/0151594 A1 | 6/2008 | Vollrath | |
| 2008/0191780 A1 | 8/2008 | Dixon et al. | |

FOREIGN PATENT DOCUMENTS

| | | |
|---|---|---|
| FR | 2846461 A1 | 4/2004 |
| WO | WO-2006/083700 | 8/2006 |

OTHER PUBLICATIONS

Search Report issued for British Patent Application No. 1215650.1 dated Jan. 13, 2014, 4 pages.

* cited by examiner

*Primary Examiner* — Hien Nguyen
(74) *Attorney, Agent, or Firm* — Fulbright & Jaworski LLP

(57) ABSTRACT

A reprogrammable memory, which can be, programmed a limited number of times. A plurality of one-time programmable elements are combined by a logic arrangement such that the output of that logic arrangement may be reprogrammed a limited number of times.

9 Claims, 1 Drawing Sheet

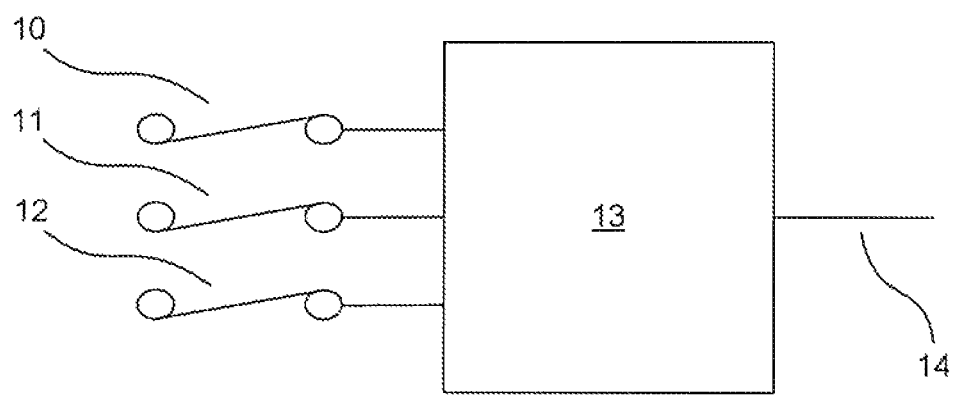

PROGRAMMABLE MEMORY WITH RESTRICTED REPROGRAMMABILITY

CROSS-REFERENCE TO RELATED APPLICATIONS

The present application claims priority from UK Patent Application No. 1215650.1 filed on Sep. 3, 2012, entitled "PROGRAMMABLE MEMORY WITH RESTRICTED REPROGRAMMABILITY", the contents of which are incorporated herein by reference.

TECHNICAL FIELD

This disclosure relates to non-volatile memories, and in particular to non-volatile memories which can only be reprogrammed a limited number of times

BACKGROUND

Non-volatile memories are commonly utilised to permanently store data in electronic devices. Non-volatile memories which are one-time programmable are utilised where there is a requirement to program data into the memory only once and thereafter for that data to be unchangeable. For example, one-time programmable memories may be used to store data that should then remain unchanged for the life of the device, such as serial numbers, IP addresses, or features of the device. One-time programmable memory may also be utilised to control access to certain features or functions of a device. For example, a device may be configured such that a test mode can only be enabled when a memory is in an unprogrammed state. When testing has been completed by the manufacturer that memory is programmed, thereby preventing the future enablement of the test mode.

One-time programmable memories may be implemented using a number of different technologies. Common examples are 'fuses' and 'anti-fuses' in which the conductivity of an electronic component is permanently altered, or FLASH type memories without a reprogramming circuit.

There are scenarios where an ability to reprogram a memory a limited number of times may be desirable. For example, where a memory is used to control access to a test mode, it may be advantageous to be able to re-activate that test mode should the device be returned to the manufacturer. Such an action is not possible with existing one-time programmable memories.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

There is provided a reprogrammable electronic memory, comprising a logic device having a plurality of inputs and an output, wherein a signal at the output changes each time a signal at one of the inputs changes; and a one-time programmable element connected to each of the inputs, each element providing a first output signal prior to programming of that element and a second output signal after programming of that element.

The logic device may perform an XOR function between the inputs.

At least one one-time programmable element may be a one-time programmable FLASH cell.

At least one one-time programmable element may be a fuse or an anti-fuse.

There may be three inputs and three one-time programmable elements.

The reprogrammable electronic memory may be implemented in an integrated circuit.

The logic device may be implemented in software.

The logic device may be implemented in hardware.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawing, in which:

The FIGURE shows a reprogrammable memory.

Common reference numerals are used throughout the FIGURE to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

The present disclosure describes an arrangement of one-time reprogrammable memory elements which allows the provision of a function with a limited number of reprogramming opportunities.

The FIGURE shows an arrangement for a providing a single-bit non-volatile memory, the output of which may be changed three times. The arrangement comprises three one-time programmable elements 10, 11, 12. For example, each element 10, 11, 12 may be a fuse or one-time programmable FLASH cell. Each element 10, 11, 12 is configured such that its output is a logic high signal when manufactured. For example, if the elements 10, 11, 12 are fuses, their input may be tied to the logic high voltage rail. The output of each fuse is connected to an input of a logic device 13 whose output signal reverses each time one of its input signals changes. For example the logic device 13 may be a parity tree formed of exclusive OR (XOR) gates. The output 14 of the logic device 13 forms the value of the single-bit non-volatile memory.

In its initial state the value of the memory is high since all three elements 10, 11, 12 are high. To reprogram the memory a first time one of the elements 10, 11, 12 is changed to output a low value. For example, if the element 10, 11, 12 is a fuse it is blown. The output 14 of the logic device 13, and hence the value of the memory, switches to low since two of the inputs are high. The value of the memory may be changed a further two times by changing the other two elements 10, 11, 12 one at a time. The memory therefore provides a value which is initially high, and which may then be set to be sequentially low, high, low. The final low value is permanent.

The memory of the FIGURE may be used in a system to control whether a test mode of the system can be accessed. The system is designed such that the test mode can only be accessed when the value of the memory is high. When initially manufactured the memory is high and thus initial testing can be performed by the manufacturer. Once the testing is complete the first element is altered such that the memory value goes low and the test mode cannot be accessed.

If the system is returned to the manufacturer, the second element is altered such that the value of the memory goes high and the test-mode is accessible again. The manufacturer can therefore perform testing. Once testing is complete the third element is altered to disable the test mode and the system can be returned to the customer without access to the test-mode.

The combination of signals from a plurality of one-time programmable elements thereby provides a memory which can be programmed a limited number of times. Since there is the possibility to reverse the settings of the memory it is suitable for the control of features that are not critical should a customer ascertain how to alter the elements and hence access the features. For example, access to test-modes by customers may be undesirable but not critical and therefore the memory would be appropriate. However, the memory would not be suitable for restricting access to features not purchased by a customer in a particular model of the system.

A plurality of the memories of the FIGURE may be combined to provide a bank of re-programmable memories; for example where it is required to control more than one feature or to store a value.

As will be appreciated fuses, anti-fuses, and one-time programmable FLASH have been provided as examples of how the elements may be implemented, but any one-time programmable component may be utilised.

The example of the FIGURE provides three elements to allow the memory to be programmed three times, but as will be appreciated any number of elements may be utilised to provide the required number of programming steps.

The device may be provided in any way depending on the particular system in which it is used. The logic device may be provided in hardware or software. For example, the entire memory may be provided in part of an IC, the elements may be dedicated components with the logic device provided by logic of the main parts of the IC, or the elements and/or logic device may be provided in a dedicated IC separate to the IC utilising the output of the memory.

In the above example the initial output of the one-time programmable elements is high, but this may be low depending on the technology utilised to manufacture the elements. The operation of the device is the same regardless of the starting state, with the required modification to the logic design to provide the required outputs.

As will be appreciated the term 'fuse' is used to indicate a component whose conductance is permanently changed when the device is 'blown', but does not necessarily require a length of conductor that is physically destroyed when the fuse is blown.

The term 'programming' is not used herein in the sense of computer software programming, but rather in the sense of setting a value of the component to which the term refers.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

What is claimed is:

1. A system to control access to a test mode, the system comprising:
    a logic device having a plurality of inputs and an output, wherein a signal at the output changes each time a signal at one of the inputs changes, the output sequentially changing between a value which allows access to the test mode and a value which does not allow access to the test mode; and
    a one-time programmable element connected to each of the inputs, each element providing a first output signal prior to programming of that element and a second output signal after programming of that element.

2. A system according to claim 1, wherein the logic device performs an XOR function between the inputs.

3. A system according to claim 1, wherein at least one one-time programmable element is a one-time programmable FLASH cell.

4. A system according to claim 1, wherein at least one one-time programmable element is a fuse.

5. A system according to claim 1, wherein at least one one-time programmable element is an anti-fuse.

6. A system according to claim 1, wherein there are three inputs and three one-time programmable elements.

7. A system according to claim 1 implemented in an integrated circuit.

8. A system according to claim 1, wherein the logic device is implemented in software.

9. A system according to claim 1, wherein the logic device is implemented in hardware.

* * * * *

UNITED STATES PATENT AND TRADEMARK OFFICE
CERTIFICATE OF CORRECTION

| | | |
|---|---|---|
| PATENT NO. | : 8,913,454 B2 | Page 1 of 1 |
| APPLICATION NO. | : 13/648723 | |
| DATED | : December 16, 2014 | |
| INVENTOR(S) | : Mel Gerard Long | |

It is certified that error appears in the above-identified patent and that said Letters Patent is hereby corrected as shown below:

ON THE TITLE PAGE
Insert
-- (30) Foreign Application Priority Data
Sep. 3, 2012  (GB) ....................................... 1215650.1 --

Signed and Sealed this
Seventeenth Day of May, 2016

Michelle K. Lee
*Director of the United States Patent and Trademark Office*